(12) United States Patent
Lin

(10) Patent No.: US 7,852,020 B2
(45) Date of Patent: Dec. 14, 2010

(54) LAMP OVERLOAD DETECTION/MODULATION CIRCUIT

(76) Inventor: Ming-Hui Lin, 15Fl-2, No.177, Daye Rd., Taichung City (TW)

( * ) Notice: Subject to any disclaimer, the term of this patent is extended or adjusted under 35 U.S.C. 154(b) by 386 days.

(21) Appl. No.: 12/171,018

(22) Filed: Jul. 10, 2008

(65) Prior Publication Data

US 2010/0007278 A1    Jan. 14, 2010

(51) Int. Cl.
*H05B 37/02* (2006.01)

(52) U.S. Cl. .................. 315/308; 315/246; 315/299

(58) Field of Classification Search ............. 315/246, 315/291, 299, 307, 308; 361/78, 79
See application file for complete search history.

(56) References Cited

U.S. PATENT DOCUMENTS

| | | | | |
|---|---|---|---|---|
| 3,719,858 A | * | 3/1973 | Gilbreath | .............. 361/55 |
| 5,452,173 A | * | 9/1995 | Brannon et al. | .............. 361/94 |
| 7,768,242 B2 | * | 8/2010 | Wei et al. | .............. 323/222 |
| 2008/0043392 A1 | * | 2/2008 | Yang | .............. 361/93.1 |
| 2009/0128058 A1 | * | 5/2009 | Ahmed et al. | .............. 315/307 |

* cited by examiner

*Primary Examiner*—Thuy Vinh Tran
(74) *Attorney, Agent, or Firm*—Ming Chow Sinorica, LLC

(57) ABSTRACT

A lamp overload detection/modulation circuit including a microcontroller unit for detecting rectangular wave signal reflective of the power used by the lamp load and pulse width signal of AC power. The positive bandwidths of the two signals are compared with a predetermined full-load value. In the case that the positive bandwidths of the two signals are both larger than the full-load value, it is indicated that the lamp load is under an overload condition. Under such circumstance, the microcontroller unit controls a lamp load driving unit to change driving manner and lower the power used by the lamp load to a value within a nominal range. Then the lamp load automatically restores to the full-load state. Accordingly, the lamp is protected from long-term overload condition.

3 Claims, 2 Drawing Sheets

US 7,852,020 B2

LAMP OVERLOAD DETECTION/MODULATION CIRCUIT

BACKGROUND OF THE INVENTION

The present invention is related to lamp control technique, and more particularly to a lamp overload detection/modulation circuit.

In conventional lamp control field, there is no technique capable of effectively limiting the power used by a lamp load. Therefore, in the case that the power used by a lamp exceeds a safety or nominal upper limit, the power can be hardly adjusted and lowered. As a result, the lamp may burn out due to long-term overload. This will lead to danger in use of the lamp. In order to ensure security in use of the lamp and save energy in consideration of environment protection, it is necessary to control and adjust the power consumed by an overloaded lamp load.

SUMMARY OF THE INVENTION

It is therefore a primary object of the present invention to provide a lamp overload detection/modulation circuit, which is able to detect the power used by a lamp load. In condition of overload, the lamp overload detection/modulation circuit will automatically adjust the power to protect the lamp from burning out and ensure security in use of the lamp.

According to the above object, the lamp overload detection/modulation circuit of the present invention includes a microcontroller unit for detecting rectangular wave signal reflective of the power used by the lamp load and pulse width signal of AC power. The positive bandwidths of the two signals are compared with a predetermined full-load value. In the case that the positive bandwidths of the two signals are both larger than the full-load value, it is indicated that the lamp load is under an overload condition. Under such circumstance, the microcontroller unit controls a lamp load driving unit to change driving manner and lower the power used by the lamp load to a value within a nominal range. Then the lamp load automatically restores to the full-load state. Accordingly, the lamp is protected from long-term overload condition.

The present invention can be best understood through the following description and accompanying drawings wherein:

DETAILED DESCRIPTION OF THE PREFERRED EMBODIMENTS

Figure 1:
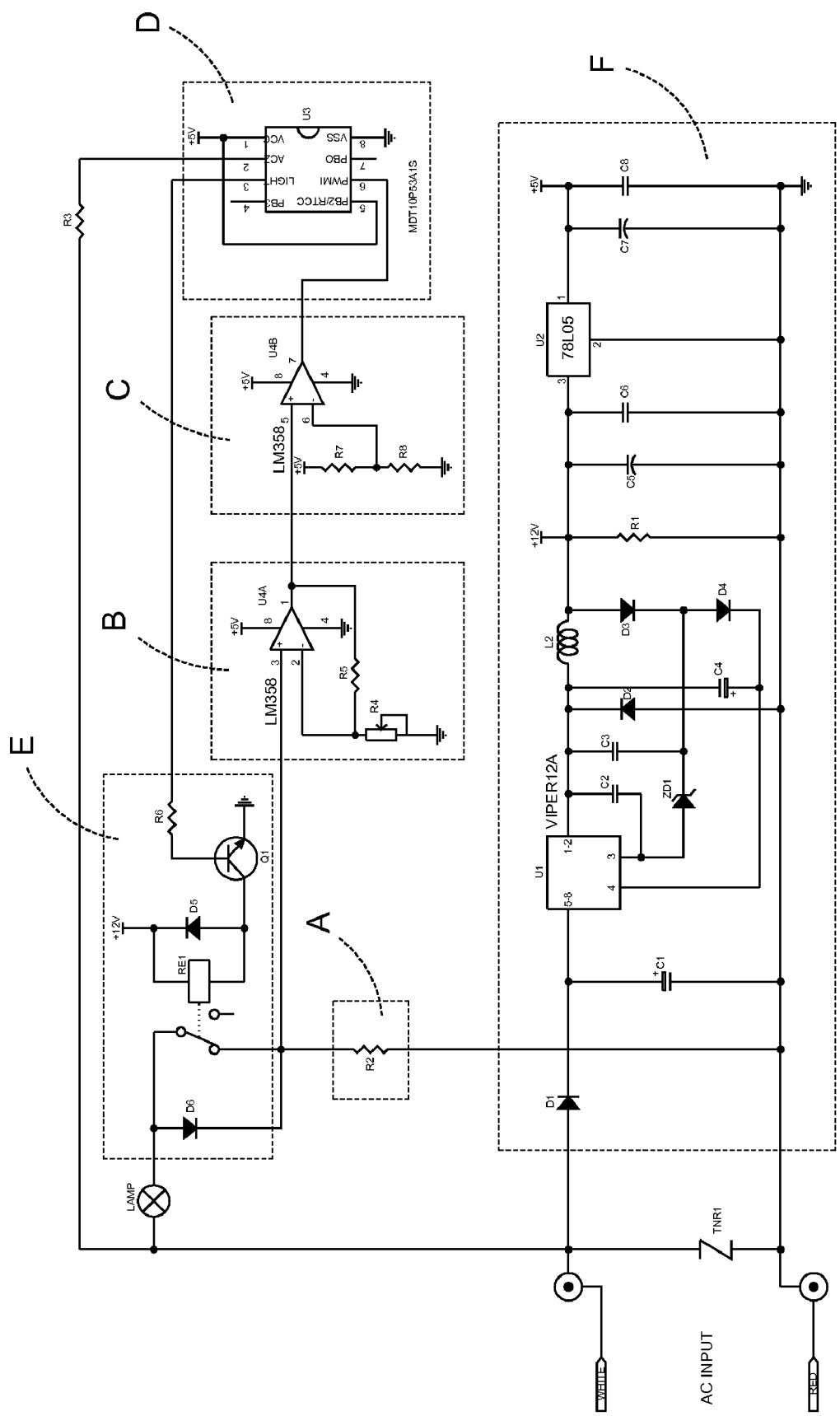
FIG. 1 is a circuit diagram of a preferred embodiment of the lamp overload detection/modulation circuit of the present invention.

Please refer to FIG. 1, which is a circuit diagram of a first embodiment of the lamp overload detection/modulation circuit of the present invention. According to the first embodiment, the lamp overload detection/modulation circuit of the present invention includes a sampling unit A, a signal amplifier unit B, a comparison unit C, a controlling unit D, a load driving unit E and a power supply unit F.

The sampling unit A includes a sampling resistor R2. A first terminal of the sampling resistor R2 is connected to an AC input terminal REd for picking up a sine wave sampled signal reflective of the power voltage used by a lamp load.

The signal amplifier unit B includes an amplifying control chip U4A, a fourth resistor R4 and a fifth resistor R5 and serves to amplify the sampled signal. An in-phase input terminal of the amplifying control chip U4A is connected to the sampling resistor R2, while an output terminal of the amplifying control chip U4A is connected to an inverted input terminal of the amplifying control chip U4A via the fifth resistor R5. The inverted input terminal of the amplifying control chip U4A is grounded via the fourth resistor R4.

The comparison unit C includes a comparison control chip U4B, a seventh resistor R7 and an eighth resistor R8 and serves to convert sine wave amplified sampled signal into rectangular wave signal. An in-phase input terminal of the comparison control chip U4B is connected to the output terminal of the amplifying control chip U4A. An inverted input terminal of the comparison control chip U4B is connected to a 5-volt power supply via the seventh resistor R7 and grounded via the eighth resistor R8.

The controlling unit D includes a microcontroller unit U3. A first current-limiting signal input terminal PWMI is positioned on a pin 6 of the microcontroller unit U3 and connected to an output terminal of the comparison control chip U4B. A second current-limiting signal input terminal ACZ is positioned on a pin 2 of the microcontroller unit U3 and connected between the microcontroller unit U3 and lamp load circuit for inputting AC voltage signal. A control signal output terminal Light is positioned on a pin 3 of the microcontroller unit U3 and connected to the load driving unit E for detecting positive bandwidth of the signal input from the first and second current-limiting signal input terminals PWMI, ACZ and comparing the positive bandwidth with a preset full-load value.

The load driving unit E includes a drive diode D6 positioned in the circuit of the controlled lamp. A positive electrode of the drive diode D6 is connected to an input terminal WhitE of an AC power. A negative electrode of the drive diode D6 is connected to a second terminal of the sampling resistor R2. A base of an NPN transistor Q1 is connected to the lamp control signal output terminal Light of the microcontroller unit U3 via a sixth resistor R6. An emitter of the NPN transistor Q1 is grounded. A collector of the NPN transistor Q1 is connected to a positive electrode of a fifth diode D5 and a first end of a coil of a relay REt. A negative electrode of the fifth diode D5 and a second end of the coil of the relay REt are connected to a 12-volt power supply. A normally closed switch controlled by the relay REt is parallelly connected with the drive diode D6.

The power supply unit F serves to supply power for the above units.

In the above lamp overload detection/modulation circuit, the sampling unit A samples a sampled voltage signal from the lamp load circuit. The sampled signal is amplified by the amplifying control chip U4A and output to the comparison unit C. The comparison unit C compares the amplified sampled voltage signal with a standard potential preset in the comparison control chip U4B. In the case that the amplified sampled voltage signal is lower than the standard potential, the comparison control chip U4B will not output any signal. In the case that the amplified sampled voltage signal is higher than the standard potential, the comparison control chip U4B outputs corresponding rectangular wave signal. The positive bandwidth of the output rectangular wave signal is varied with the power used by the lamp load. The microcontroller unit U3 can judge whether the power of the lamp load should be limited on the basis of the positive bandwidth. That is, in the case that there is no rectangular wave signal output from the output terminal of the comparison control chip or the positive bandwidth of the output rectangular wave signal is smaller than a fixed value, the microcontroller unit U3 will not adjust the power used by the lamp load, permitting the lamp load to work at maximum power. On the other hand, in the case that the positive bandwidth of the rectangular wave signal output from the comparison control chip U4B is larger than a corresponding full-load value and the positive bandwidth of the pulse width signal of AC power is also larger than the corresponding full-load value, the microcontroller unit U3 energizes the relay REt of the load driving unit E to open the normally closed switch. Accordingly, the drive diode D6 is activated to work, whereby the lamp load works in a half-wave state to lower the power used by the lamp load. When the positive bandwidth of the signal input from the first and second current-limiting signal input terminals PWMI, ACZ is smaller than the corresponding full-load value, the load lamp is restored to its full-power working state.

Figure 2:
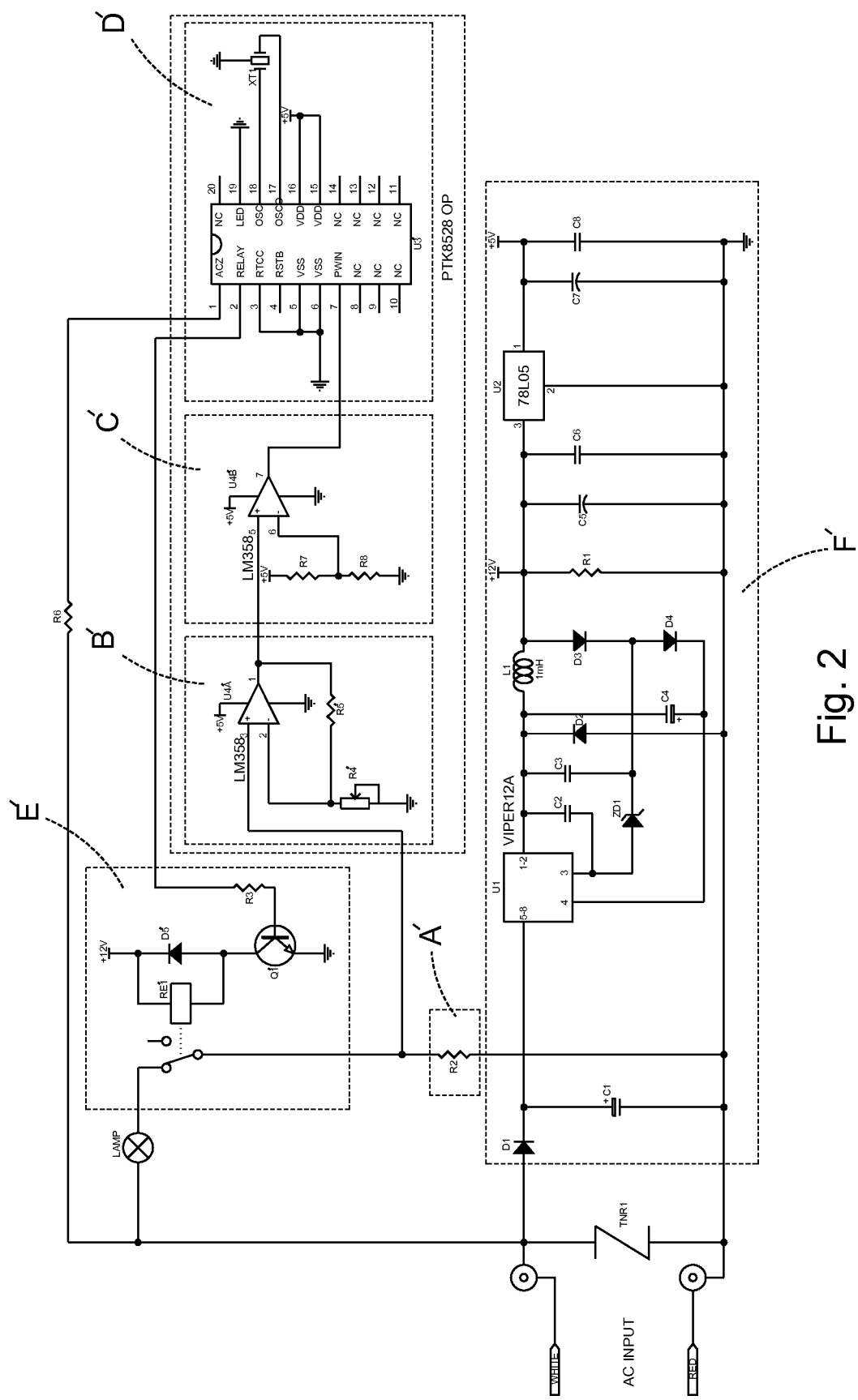
FIG. 2 is a circuit diagram of another preferred embodiment of the lamp overload detection/modulation circuit of the present invention.

FIG. 2 shows another embodiment of the lamp overload detection/modulation circuit of the present invention, which is substantially identical to the above embodiment. The only difference between the two embodiments is that a pin 2 of the microcontroller unit U3' of the controlling unit D' of the second embodiment serves as the control signal output terminal RELAY for outputting control signal for the relay.

When the second embodiment of the lamp overload detection/modulation circuit detects that the lamp load is under overload condition, the controlling unit D' controls energization and cutoff of the transistor Q1' of the load driving unit E'. Accordingly, the switch controlled by the relay RE1' is alternately opened and closed. Under such circumstance, the lamp load will continuously flicker until the power used by the lamp load becomes not higher than the full-load value. Accordingly, the lamp is protected from burning out and the energy can be saved.

The above embodiments are only used to illustrate the present invention, not intended to limit the scope thereof. Many modifications of the above embodiments can be made without departing from the spirit of the present invention. For example, the controlling unit can control the relay to itself directly break the power supply circuit of the lamp load so as to protect the lamp load.

What is claimed is:

1. A lamp overload detection/modulation circuit comprising:
    a sampling unit arranged in a lamp load circuit, the sampling unit including a sampling resistor, a first terminal of the sampling resistor being connected to an AC input terminal for picking up a sampled voltage signal reflective of the power voltage used by a lamp load;
    a signal amplifier unit for amplifying the sampled signal picked up by the sampling unit, the signal amplifier unit including an amplifying control chip, an in-phase input terminal of the amplifying control chip being connected to a second terminal of the sampling resistor;
    a comparison unit for converting sine wave amplified sampled signal into rectangular wave signal, the comparison unit including a comparison control chip, an in-phase input terminal of the comparison control chip being connected to an output terminal of the amplifying control chip;
    a controlling unit including a microcontroller unit, a first current-limiting signal input terminal being connected between the microcontroller unit and an output terminal of the comparison control chip, a second current-limiting signal input terminal being connected between the microcontroller unit and the lamp load circuit for inputting AC voltage signal, a control signal output terminal of the microcontroller unit serving to output control signal for detecting positive bandwidth of the rectangular wave signal and positive bandwidth of the pulse width signal of AC power, whereby in the case that the positive bandwidths of the two signals are both smaller than a predetermined value, the microcontroller unit will not output any control signal, while in the case that the positive bandwidths of the two signals are both larger than the predetermined value, the controlling unit outputs a control signal; and
    a load driving unit including a transistor, a base of the transistor being connected to the control signal output terminal of the microcontroller unit, the load driving unit further including a relay arranged in the lamp load circuit, a terminal of the relay being connected to a collector of the transistor for receiving the control signal output from the controlling unit, whereby the relay can change the power supplied for the lamp load.

2. The lamp overload detection/modulation circuit as claimed in claim 1, wherein when the load driving unit receives the control signal output from the controlling unit, the switch controlled by the relay is alternately opened and closed, whereby the lamp load continuously flicker.

3. The lamp overload detection/modulation circuit as claimed in claim 1, wherein the load driving unit further includes a drive diode parallelly connected with the relay, whereby when the load driving unit receives the control signal output from the controlling unit, the drive diode is activated to work and make the lamp load work in a half-wave state of AC power.

* * * * *